(12) United States Patent
Crockett

(10) Patent No.: US 11,946,141 B2
(45) Date of Patent: Apr. 2, 2024

(54) AUTOMATED CONVEYANCE OF ARTICLES IN CHEMICAL VAPOR PROCESSING

(71) Applicant: Hewlett-Packard Development Company, L.P., Spring, TX (US)

(72) Inventor: Michael Anthony Crockett, Vancouver, WA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 128 days.

(21) Appl. No.: 17/414,129

(22) PCT Filed: Sep. 12, 2019

(86) PCT No.: PCT/US2019/050786
§ 371 (c)(1),
(2) Date: Jun. 15, 2021

(87) PCT Pub. No.: WO2021/050070
PCT Pub. Date: Mar. 18, 2021

(65) Prior Publication Data
US 2022/0195596 A1   Jun. 23, 2022

(51) Int. Cl.
*C23C 16/458*   (2006.01)
*C23C 16/54*   (2006.01)

(52) U.S. Cl.
CPC .......... *C23C 16/4582* (2013.01); *C23C 16/54* (2013.01)

(58) Field of Classification Search
CPC .............. C23C 16/4582; C23C 16/54
See application file for complete search history.

(56) References Cited

U.S. PATENT DOCUMENTS

| | | | | |
|---|---|---|---|---|
| 4,962,726 A | * | 10/1990 | Matsushita | C23C 16/54 |
| | | | | 414/217 |
| 5,121,705 A | | 6/1992 | Sugino | |
| 5,817,575 A | * | 10/1998 | Han | C23C 16/4412 |
| | | | | 438/683 |
| 7,670,754 B2 | | 3/2010 | Edo et al. | |

(Continued)

FOREIGN PATENT DOCUMENTS

| | | | |
|---|---|---|---|
| GB | 2560073 A1 | † | 8/2018 |
| GB | 2560073 | * | 6/2020 |
| RU | 2625848 C1 | | 7/2017 |

*Primary Examiner* — Nathan T Leong
(74) *Attorney, Agent, or Firm* — Michael Dryja

(57) ABSTRACT

An apparatus for automated chemical vapor processing. The apparatus includes a chemical vapor processing chamber to treat articles with surface-smoothing chemical vapor and an article loading chamber to receive articles pending treatment by the chemical vapor processing chamber. The apparatus further includes an automated conveyor to move the articles between the article loading chamber and the chemical vapor processing chamber. The apparatus further includes an air lock to connect the article loading chamber to the chemical vapor processing chamber, and a controller to control the automated conveyor to move the articles between the article loading chamber and the chemical vapor processing chamber, and to control the air lock to seal the chemical vapor processing chamber from the article loading chamber when the automated conveyor is not moving articles between the article loading chamber and the chemical vapor processing chamber.

12 Claims, 7 Drawing Sheets

(56) References Cited

U.S. PATENT DOCUMENTS

| | | |
|---|---|---|
| 8,075,300 B2 | 12/2011 | Zinniel |
| 8,273,670 B1 | 9/2012 | Rivkin et al. |
| 9,174,469 B2 | 11/2015 | Lowrance et al. |
| 2019/0143412 A1 | 5/2019 | Buller et al. |
| 2021/0387415 A1† | 12/2021 | Crabtree |

\* cited by examiner
† cited by third party

| Article ID | Entry Port | Time Entered Loading Chamber | Time Entered Processing Chamber | Set Exposure Time | Time Remaining | Exit Port |
|---|---|---|---|---|---|---|
| A103A | 1 | 7:13 | 7:15 | 0:20 | 0:00 | 1 |
| A103B | 2 | 7:26 | 7:28 | 0:25 | 0:08 | N/A |
| A103C | 3 | 7:30 | 7:32 | 0:15 | 0:02 | N/A |
| A103E | 4 | 7:45 | PENDING | 0:25 | 0:25 | N/A |

FIG. 4A

| Port ID | Status | Article ID | Article Status |
|---|---|---|---|
| 1 | FILLED | 103A | COMPLETE |
| 2 | EMPTY | N/A | N/A |
| 3 | EMPTY | N/A | N/A |
| 4 | FILLED | A103E | PENDING PROCESSING |

FIG. 4B

AUTOMATED CONVEYANCE OF ARTICLES IN CHEMICAL VAPOR PROCESSING

BACKGROUND

Chemical vapor processing is a technique to make a surface modification to a manufactured article using chemical vapors. For example, acetone vapors may be used to smooth down rough surfaces of an article. Typically, a batch of articles is placed inside a sealed processing chamber and exposed to chemical vapors which act on the surfaces of the articles over a period of time. The chemical vapors can act to smooth down rough surfaces of 3D-printed articles such as the lines and ridges left behind by the deposition of successive layers of printing material.

BRIEF DESCRIPTION OF THE DRAWINGS

FIG. 4A is a table depicting an example data structure of article tracking data for an apparatus for automated chemical vapor processing.

FIG. 4B is a table depicting an example data structure of access port status data for an apparatus for automated chemical vapor processing.

DETAILED DESCRIPTION

Chemical vapor processing, when applied as a batch process, is an inherently slow process. Between each batch, time is taken to clear the processing chamber of potentially harmful chemical vapors, replace the finished articles with new articles for treatment, refill the processing chamber with chemical vapors, and establish new processing conditions for the next batch of articles. These steps not only add to overall manufacture time, but also provide challenges for integration with other continuous manufacturing systems.

Further, some manufactured articles may have greater levels of surface roughness than others, and so may be treated for greater lengths of time, or under different processing conditions, such as a higher temperature, to achieve a desired surface finish. Chemical vapor processing is therefore often applied as a batch process so that process parameters and exposure time can be precisely controlled.

The present disclosure provides for chemical vapor processing that may be operated on a continuous or semi-continuous basis without clearing the processing chamber of chemical vapor when articles are being moved in and out of the processing chamber. Further, process parameters and exposure time may be precisely controlled.

Thus, an apparatus for automated chemical vapor processing includes a chemical vapor processing chamber, an article loading chamber to receive articles pending treatment by the chemical vapor processing chamber, and an automated conveyor to move the articles between the article loading chamber and the chemical vapor processing chamber. The chemical processing chamber and article loading chamber are connected by an air lock that is normally sealed and which is controlled to open when the automated conveyor is moving articles between the article loading chamber and the chemical vapor processing chamber. A controller controls the automated conveyor and the air lock. The controller may track the time spent by articles in the processing chamber and cause the automated conveyor to remove articles that are finished treatment at the appropriate time.

Thus, manufactured articles may be processed by chemical vapor processing on an on-demand basis and without the burden of clearing the processing chamber for each new batch of articles. Further, reduced downtime of the processing chamber may allow for a greater number of articles to processed overall within a period of time. Further still, articles that are to be exposed to chemical vapors for different lengths of times may be processed in parallel and automatically removed from the processing chamber at the appropriate time. Moreover, the processing chamber may be continuously operated for more seamless integration with other continuously operating manufacturing processes. Such an apparatus may be applied to chemical vapor smoothing of 3D-printed articles or other manufactured articles.

Figure 1:
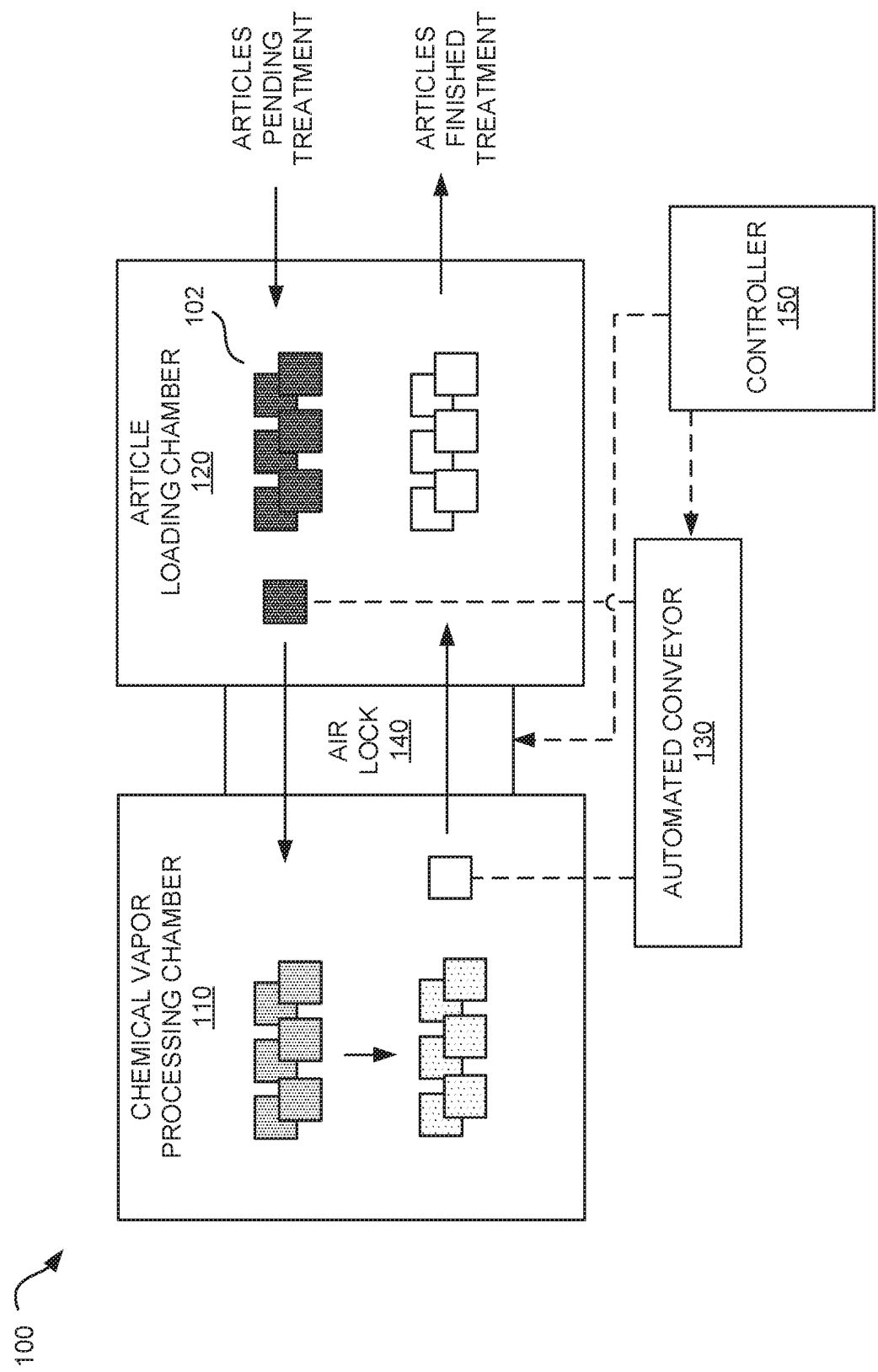
FIG. 1 is a schematic diagram of an example apparatus for automated chemical vapor processing.

FIG. 1 is a schematic diagram of such an example apparatus 100 for automated chemical vapor processing. The apparatus 100 includes a chemical vapor processing chamber 110 to treat articles with surface-smoothing chemical vapor. The chemical vapor processing chamber 110 includes storage space for articles 102 to be placed while undergoing chemical vapor processing, and may include storage systems such as shelving or racking on which articles 102 undergoing treatment may be placed. The chemical vapor processing chamber 110 further includes processing equipment to provide the chemical vapor processing and maintain processing parameters, such as nozzles to deliver the chemical vapors, a heater to heat the vapor, a vacuum pump to control pressure, and a fan to circulate chemical vapors.

The apparatus 100 further includes an article loading chamber 120 to receive articles 102 pending treatment by the chemical vapor processing chamber 110. The article loading chamber 120 is further to provide access to articles 102 finished treatment by the chemical vapor processing chamber 110 so that the finished articles 102 may be retrieved by an operator of the apparatus 110 or by integrated machinery. The articles 102 may be placed into the article loading chamber 120, and retrieved from the article loading chamber 120, by access ports such as doors or hatches and the like.

Figure 2A:
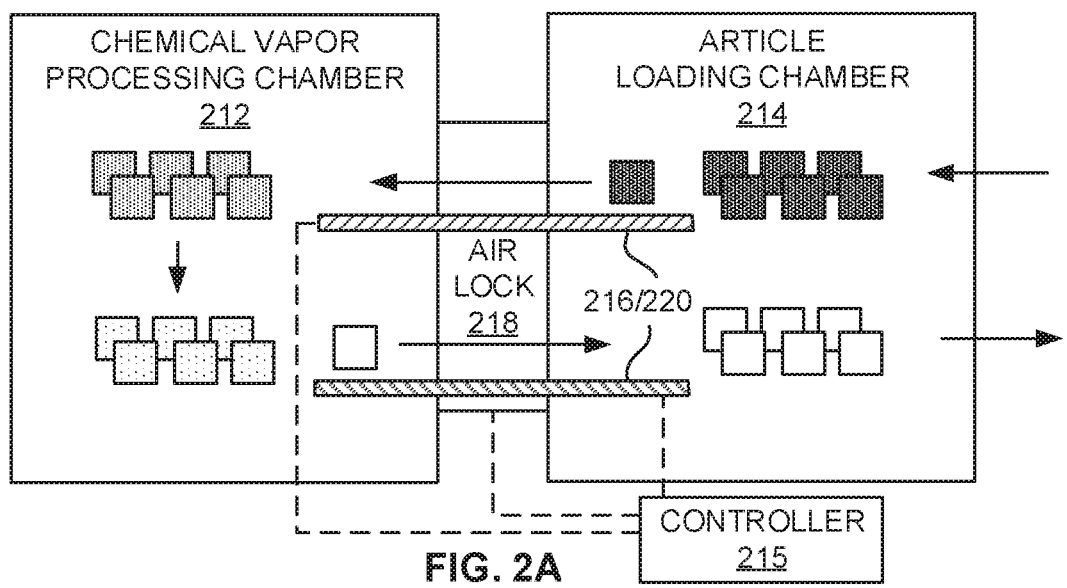
FIG. 2A is a schematic diagram of another example apparatus for automated chemical vapor processing, the apparatus including a conveyor belt system to move articles between a chemical vapor processing chamber and an article loading chamber.
Figure 2B:
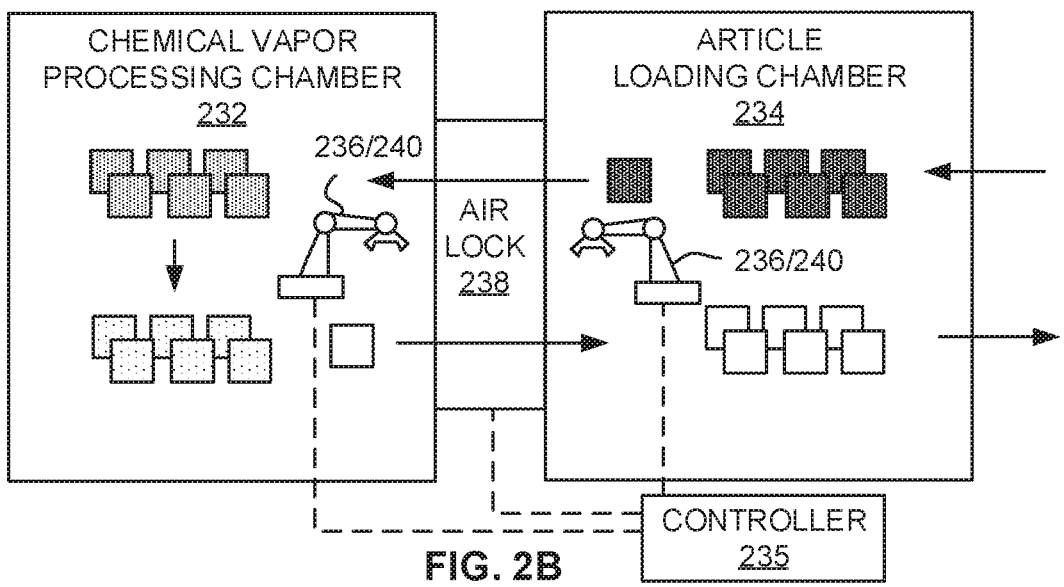
FIG. 2B is a schematic diagram of another example apparatus for automated chemical vapor processing, the apparatus including a robotic picker system to move articles between a chemical vapor processing chamber and an article loading chamber.

The apparatus 100 further includes an automated conveyor 130 to move articles 102 between the article loading chamber 120 and the chemical vapor processing chamber 110. The automated conveyor 130 may include a conveyor belt system (e.g., as shown in FIG. 2A), robotic arm picker (e.g., as shown in FIG. 2B), or a combination of such and similar.

Figure 7A:
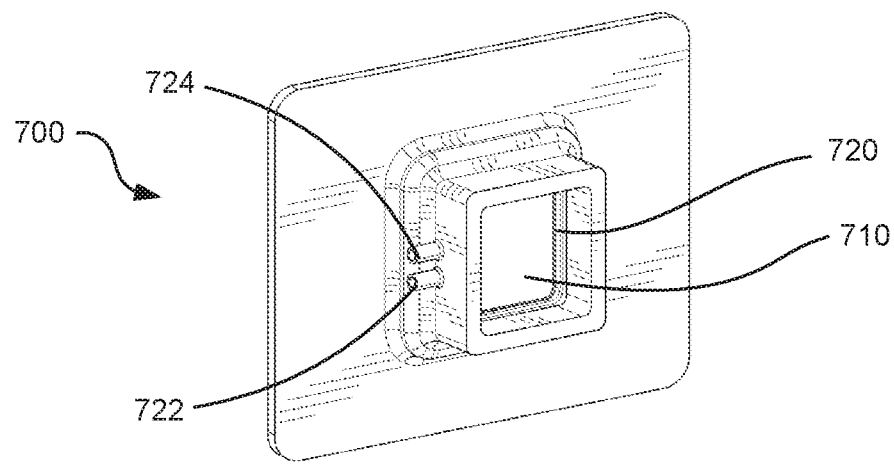
FIG. 7A is a perspective view of an example air lock for an apparatus for automated chemical vapor processing as viewed from the inside of an article loading chamber.

The apparatus 100 further includes an air lock 140 to connect the article loading chamber 120 to the chemical vapor processing chamber 110. The air lock 140 seals the chemical vapor processing chamber 110 from the article loading chamber 120 when closed, and the air lock 140 is normally closed when the automated conveyor 130 is not moving articles 102 between the article loading chamber 120 and the chemical vapor processing chamber 110. In other words, the air lock 140 is normally closed when the automated conveyor 130 is inactive. The air lock 140 may include a door, hatch, or other sealable portal. For example, the air lock 140 may include a door and pneumatic seal, as shown in FIGS. 7A through 7O, below. Further, the air lock 140 may be actuated by a fail-closed actuator so that the air lock 140 seals the article loading chamber 120 from vapors in the chemical vapor processing chamber 120 in the event of a system failure.

The apparatus 100 further includes a controller 150 to control the automated conveyor 130 to move the articles 120 between the article loading chamber 120 and the chemical vapor processing chamber 110, and to control the air lock 140 to seal the chemical vapor processing chamber 110 from the article loading chamber 120 when the automated conveyor 130 is not moving articles between the article loading chamber 120 and the chemical vapor processing chamber 110. The controller 150 includes a processor and memory to execute machine-readable instructions to perform any of the tasks described herein as being performed by the controller 150.

The article loading chamber 120 may be ventilated or otherwise cleared of chemical vapors on a regular or periodic basis by a chemical vapor remover such as a chemical vapor scrubber, condenser, or ventilator, for safety and environmental control purposes.

Thus, the article loading chamber 120 may be kept safe for access by an operator or by machinery to retrieve finished articles 102, and submit new articles 102 for processing, while the automated conveyor 130 and air lock 140 cooperate to minimize leakage of chemical vapor from the chemical vapor processing chamber 110 while articles 102 are moved between the chemical vapor processing chamber 110 and article loading chamber 120. Such an apparatus 100 may therefore by continuously or semi-continuously operated without taking the time to clear the chemical vapor processing chamber 110 and reset the processing parameters thereof between batches of articles 102.

FIG. 2A is a schematic diagram of another example apparatus 210 for automated chemical vapor processing. The apparatus 210 is similar to the apparatus 100 of FIG. 1, and thus includes a chemical vapor processing chamber 212, article loading chamber 214, automated conveyor 216, and air lock 218, and controller 215. For further description of the above elements, the description of like elements of the apparatus 100 of FIG. 1 may be referenced.

In the apparatus 210, the automated conveyor 216 includes a conveyor belt system 220 to move articles between the chemical vapor processing chamber 212 and the article loading chamber 214. In some examples, the conveyor belt system 220 may include a single conveyor belt which may be move into position through the air lock 218 to form a bridge between the chambers 212, 214, to transfer articles between the chambers 212, 214. In other examples, the conveyor belt system 220 may include an inlet conveyor belt to move articles from the article loading chamber 214 to the chemical vapor processing chamber 212, and an outlet conveyor belt to move articles from the chemical vapor processing chamber 212 to the article loading chamber 214. The conveyor belt system 220 may further include additional conveyor belts to position the articles within the respective chambers 212, 214.

FIG. 2B is a schematic diagram of another example apparatus 230 for automated chemical vapor processing. The apparatus 230 is similar to the apparatus 100 of FIG. 1, and thus includes a chemical vapor processing chamber 232, article loading chamber 234, automated conveyor 236, and air lock 238, and controller 215. For further description of the above elements, the description of like elements of the apparatus 100 of FIG. 1 may be referenced.

In the apparatus 230, the automated conveyor 236 includes a robotic picker system 240 to transfer articles between the chambers 232, 234. In some examples, the robotic picker system 240 may include a single picker arm capable of reaching through the air lock 238 into either chambers 232, 234, to transfer articles between the chambers 232, 234. In other examples, the robotic picker system 240 may include a picker arm in each chamber 232, 234, to transfer articles through the air lock 238 and to position articles within its respective chamber 232, 234.

Figure 3:
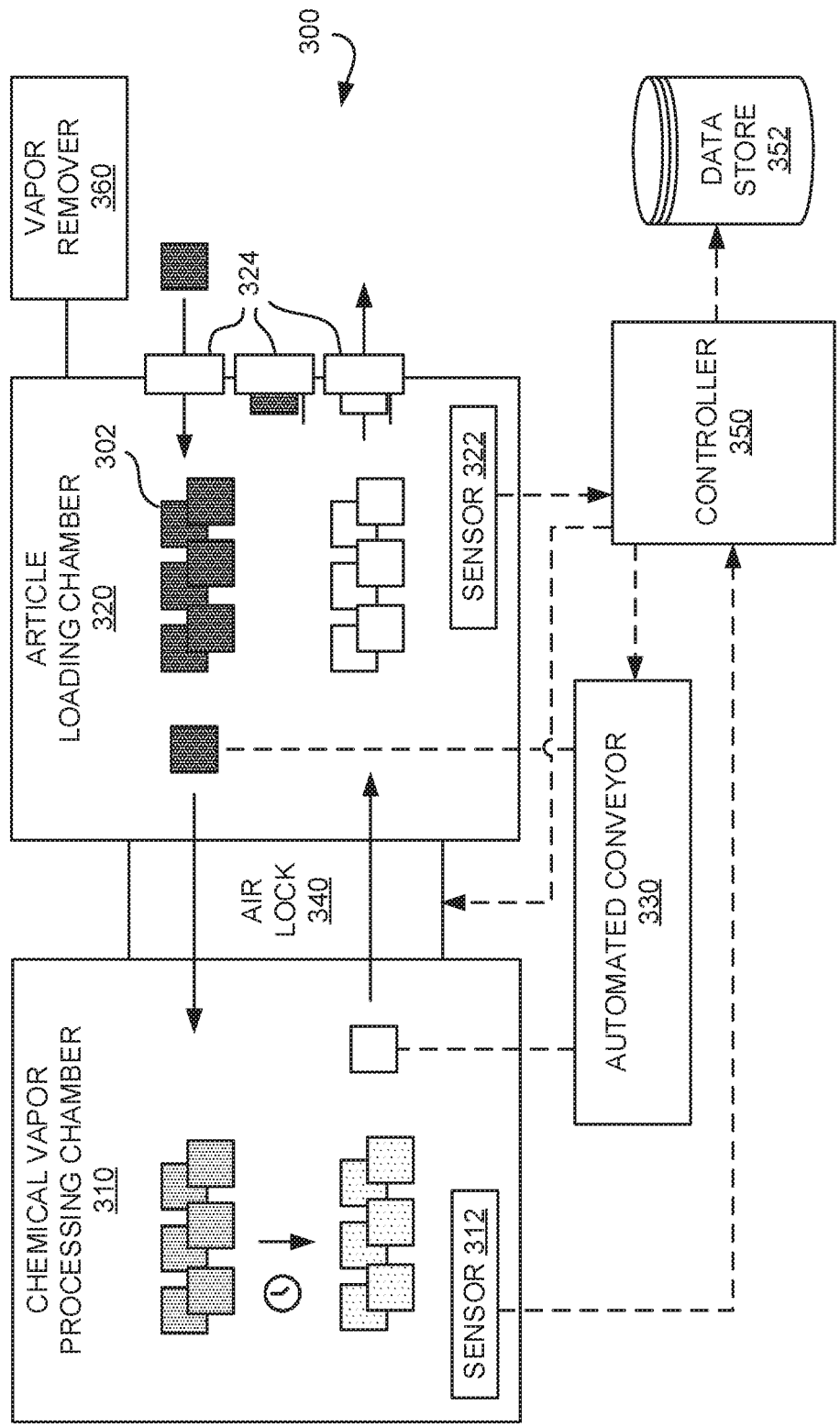
FIG. 3 is a schematic diagram of an example apparatus for automated chemical vapor processing including a controller to track the treatment of articles.

FIG. 3 is a schematic diagram of another example apparatus 300 for automated chemical vapor processing. The apparatus 300 is similar to the apparatus 100 of FIG. 1, and thus includes a chemical vapor processing chamber 310, article loading chamber 320, automated conveyor 330, air lock 340, and controller 350. For further description of the above elements, the description of like elements of the apparatus 100 of FIG. 1 may be referenced.

The apparatus 300 further includes a controller 350 to control the automated conveyor 330 to move the articles 302 between the article loading chamber 320 and the chemical vapor processing chamber 310. The controller 350 is further to control the air lock 340 to open when the automated conveyor 330 is moving articles 302 between the article loading chamber 320 and the chemical vapor processing chamber 310. The controller 350 may move the articles 302 between the chambers 310, 312, according to pre-determined treatment schedules of each article 302, as discussed below.

The controller 330 is also connected to a sensor 312 located in the chemical vapor processing chamber 310 which monitors a processing condition of the chemical vapor processing chamber 310. A processing condition may include temperature, pressure, humidity, concentration of chemical vapor composition of chemical vapor, or any other processing condition relevant to chemical vapor processing of articles 302. The chemical vapor processing chamber 310 may include a combination of such sensors 312. The processing conditions in the chemical vapor processing chamber 310 may be recorded in a data store 352. In some examples, the controller 350 may control processing equipment in the chemical vapor processing chamber 310, such as vapor nozzles, heaters, vacuum pumps, and fans, to control or maintain processing parameters in the chemical vapor processing chamber 310.

The controller 330 is also connected to a sensor 322 located in the article loading chamber 320 which monitors the presence or amount of chemical vapor in the articling loading chamber 320 for safety or environmental purposes. The article loading chamber 320 may include additional sensors to monitor other environmental conditions in the article loading chamber 320, such as temperature and pressure.

The controller 350 is to track time spent by the articles 302 in the chemical vapor processing chamber 310 and to control the automated conveyor 330 to move the articles 302 between the chemical vapor processing chamber 310 and article loading chamber 320 accordingly. For example, the controller 350 may control the automated conveyor 330 to place an article 302 from the article loading chamber 320 into the chemical vapor processing chamber 310 for treatment, and to retrieve the articles 302 from the chemical vapor processing chamber 320 after a pre-determined exposure time. In other words, the controller 350 may move the articles 302 between chambers 310, 320, according to pre-determined treatment schedules. Some of the articles 302 may have different pre-determined processing times, and as such, may be provided with different degrees of smoothing, and thus the controller 350 may cause the automated conveyor 330 to retrieve different articles 302 after different durations of exposure accordingly.

Information about the time an article 302 has spent in the chemical vapor processing chamber may be referred to as article tracking data, and may be stored in a data structure such as in the example provided in FIG. 4A, discussed below. Such article tracking data may be stored in the data store 352 and correlated with processing condition data so that a history of the processing conditions experienced by each article 302 may be recorded for later evaluation, such as for quality control purposes.

The proper exposure times for each article 302 may be provided by user input through a user interface coupled to the controller 350 or received by another manufacturing system in communication with the controller 350. In some examples, the controller 350 may be integrated with other manufacturing systems which may indicate to the controller 350 when articles 302 may be inbound for processing. In such examples, articles 302 may be labelled according to a label provided by the other manufacturing systems with which the controller 350 is integrated, and processing of the articles 302 through the apparatus 300 may be tracked using such a label.

The article loading chamber 320 further includes a plurality of access ports 324 to receive articles 302 pending treatment and to provide access to finished articles 302. Thus, an article 302 that is to be treated by chemical vapor processing may be placed by an operator or machinery in an access port 324, and an article 302 finished processing may be retrieved through an access port 324 by an operator or machinery.

Further, the automated conveyor 330 may move new articles 302 pending treatment from an access port 324 to a holding area in the article loading chamber 320 while in queue to be transported through the air lock 340 to the chemical vapor processing chamber 310. Similarly, the automated conveyor 330 may move finished articles 302 in a holding area in the article loading chamber 320 to an access port 324 for pickup.

The access portals 302 may be situated along a side or across the top of the article loading chamber 320 in a position for ease of access by an operator or machinery. The access portals 324 may include a sealable door, hatch, or other sealable portal through which an article 302 may be accessed, and which may be sealed to mitigate any chemical vapor present in the article loading chamber 210 from escaping.

The access portals 324 may include indicators such as lights or screens which display a status of the access portal 324, as in, whether the access portal is closed, opened, filled with an article 302, or ready to receive an article 302, so that an operator or machinery may identify a particular access portal 324 to use. Further, the controller 350 may track the status of the access ports 324, and store the status in a data structure, such as in the example provided in FIG. 4B, discussed below.

The controller 350 may track movement of the articles 302 inside the article loading chamber 320 and chemical vapor processing chamber 310 based on which access port 324 the articles 302 were placed in when submitted for processing. As an example, the controller 350 may label each article 302, in memory, based on the access port 324 it was received through. Articles 302 may then be tracked through the apparatus 300 using such a label.

While the air lock 340 is open, small amounts of chemical vapor from the chemical vapor processing chamber 310 may leak into the article loading chamber. Such chemical vapors may be harmful to an operating accessing the article loading chamber 320. Thus, the apparatus 300 further includes a vapor remover 360 to remove chemical vapor from the article loading chamber 320. The vapor remover 360 may include a chemical vapor scrubber, condenser, vent, or other device to clear the article loading chamber 320 of chemical vapors. The vapor remover 360 may continuously or periodically remove chemical vapor from the article loading chamber 320 to maintain the presence of chemical vapor in the article loading chamber 320 below a threshold amount. Such a threshold amount may be set according to environmental or safety standards.

For additional safety and environmental control, the controller 350 may restrict access through the access ports 324 when the automated conveyor 330 is moving articles 302 between the chemical vapor processing chamber 310 and the article loading chamber 320. That is, when the air lock 340 is open and the automated conveyor 330 is active, the access ports 324 may be blocked, locked, or otherwise made inaccessible to an operator or machinery. Further, the controller 350 may restrict access through the access ports 324 when the sensor 322 in the article loading chamber 320 detects an amount of chemical vapor above a threshold amount (e.g. when the air lock 340 was recently opened and the article loading chamber 320 has not yet been sufficiently cleared of chemical vapor), or detects another environmental condition, such as high temperature, in the article loading chamber 320. Thus, access to the article loading chamber 320 may be restricted unless the article loading chamber 320 is determined to be safely accessible.

The controller 350 may store instructions to control the automated conveyor 330 and air lock 340 in the manner described above in a non-transitory machine-readable storage medium so that the instructions are executable by the controller 350.

Thus, the article loading chamber 320 may safely by continuously or semi-continuously operated an integrated with other continuously operating manufacturing processes.

FIG. 4A is a table depicting an example data structure 402 of article tracking data for an apparatus for automated chemical vapor processing, such as the apparatus 300 of FIG. 3. For convenience, in the description of the data structure 402, reference will be made to the apparatus 300 of FIG. 3. With reference to the apparatus 300 of FIG. 3, such a data structure 402 may be stored at the data store 352 or elsewhere accessible by the controller 350. The data stored in the data structure 402 includes tracking information relevant to the treatment of articles 302 in the chemical vapor processing chamber 310.

As shown, the data structure 402 includes indications of a label for each article 302 submitted to the apparatus 300 ("Article ID"). The data structure 402 further includes an indication of the access port 324 through which each article 302 entered the apparatus 300 ("Entry Port"), the time the article 302 entered the loading chamber 320, and the time the article 302 entered the chemical vapor processing chamber 310. An article 302 may be indicated as "PENDING" if the article 302 is in the article loading chamber 320 but has not yet been moved into the chemical vapor processing chamber 310, such as when the chemical vapor processing chamber 310 lacks the capacity to treat the article 302 at this time, or when the article 302 is in queue to be moved into the chemical vapor processing chamber 310.

Further, the data structure 402 includes a pre-determined processing time ("Set Exposure Time") to indicates the amount of time each article is to spend in the chemical vapor processing chamber 310. The data structure 402 further includes an indication of the time remaining on a particular article's treatment schedule. Further, the data structure 402 includes an indication, for each of the finished articles 302, of the access port 324 in the article loading chamber through which the finished article 302 may be retrieved by an operator or machinery ("Exit Port").

In some examples, the data structure 402 may include additional positional information, such as where an article 302 is presently stored in the chemical vapor processing chamber 310 (e.g. in which shelf, aisle, rack, or other area, depending on the layout of the chemical vapor processing chamber 310), and which part of the automated conveyor 330 has access to the article 302 (e.g. which conveyor belt or robotic picker arm the article 302 is nearest, depending on the type(s) of automated conveyor 330 used).

Thus, the controller 350, or an operator thereof, may track the progress of an article 302 being processed through the apparatus 300.

FIG. 4B is a table depicting an example data structure 404 of access port status data for an apparatus for automated chemical vapor processing, such as the apparatus 300 of FIG. 3. For convenience, in the description of the data structure 404, reference will be made to the apparatus 300 of FIG. 3. With reference the apparatus 300 of FIG. 3, such a data structure 404 may be stored at the data store 352 or elsewhere accessible by the controller 350.

As shown, the data structure 404 includes an indication of an access port 324 ("Port ID"), an indication of the empty/filled status of each access port 324, an indication of a label for the article 302 present in the access port 324, if applicable ("Article ID"), and an indication of a completion status of the article 302 present in the access port 324, if applicable ("Article Status").

Thus, the controller 350, or an operator thereof, may track the progress of articles 302 resting in access ports 324 of the apparatus 300.

Figure 5:
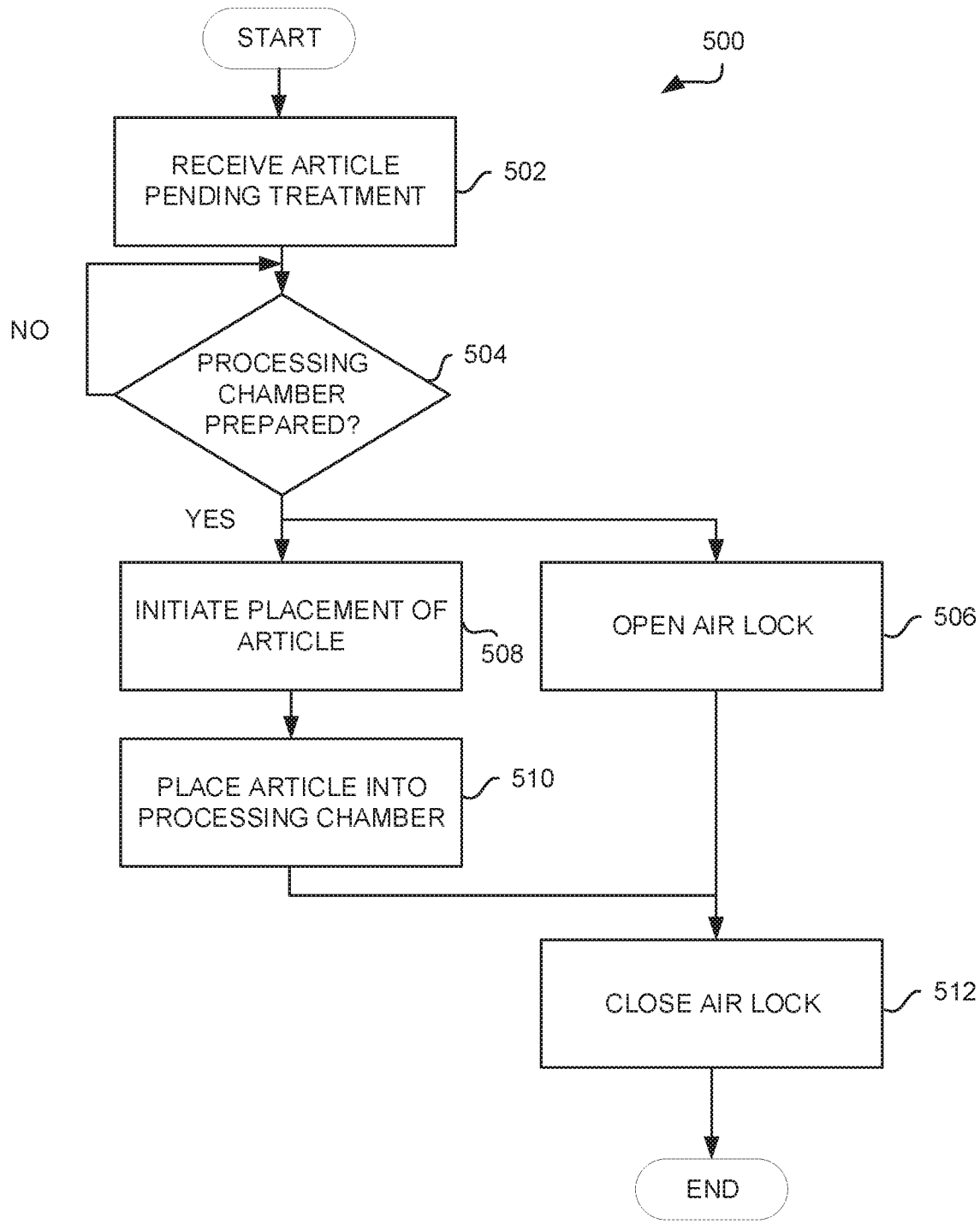
FIG. 5 is a flowchart of an example method for placing an article pending treatment into a chemical vapor processing chamber of an apparatus for automated chemical vapor processing.

FIG. 5 is a flowchart of an example method 500 for placing an article pending treatment into a chemical vapor processing chamber of an apparatus for automated chemical vapor processing, such as the apparatus 100 of FIG. 1 or the apparatus 300 of FIG. 3. For convenience, in the description of the method 500, reference will be made to the apparatus 300 of FIG. 3. One or more blocks of the method 500 may be embodied in a non-transitory machine-readable storage medium storing instructions executable by the controller 350.

At block 502, an article 302 pending treatment is received in the article loading chamber 320. At block 504, it is determined whether the chemical vapor processing chamber 310 is prepared to treat the article 302, such as by determining whether the chemical vapor processing chamber 310 has capacity for the article 302 and is operating under adequate processing parameters for the article 302. Once the chemical vapor processing chamber 310 is prepared to treat the article 302, placement of the article 302 is initiated at block 504, and the air lock 340 is opened at block 506. At block 510, the article 302 is placed into the chemical vapor processing chamber 310 by the automated conveyor 330. Placement of the article 302 may take place in a queue along with other articles 302 awaiting to be placed in the chemical vapor processing chamber 310. At block 512, the air lock 340 is closed. The exposure of the article 302 to chemical vapors in the chemical vapor processing chamber 310 may then be tracked as discussed herein.

Figure 6:
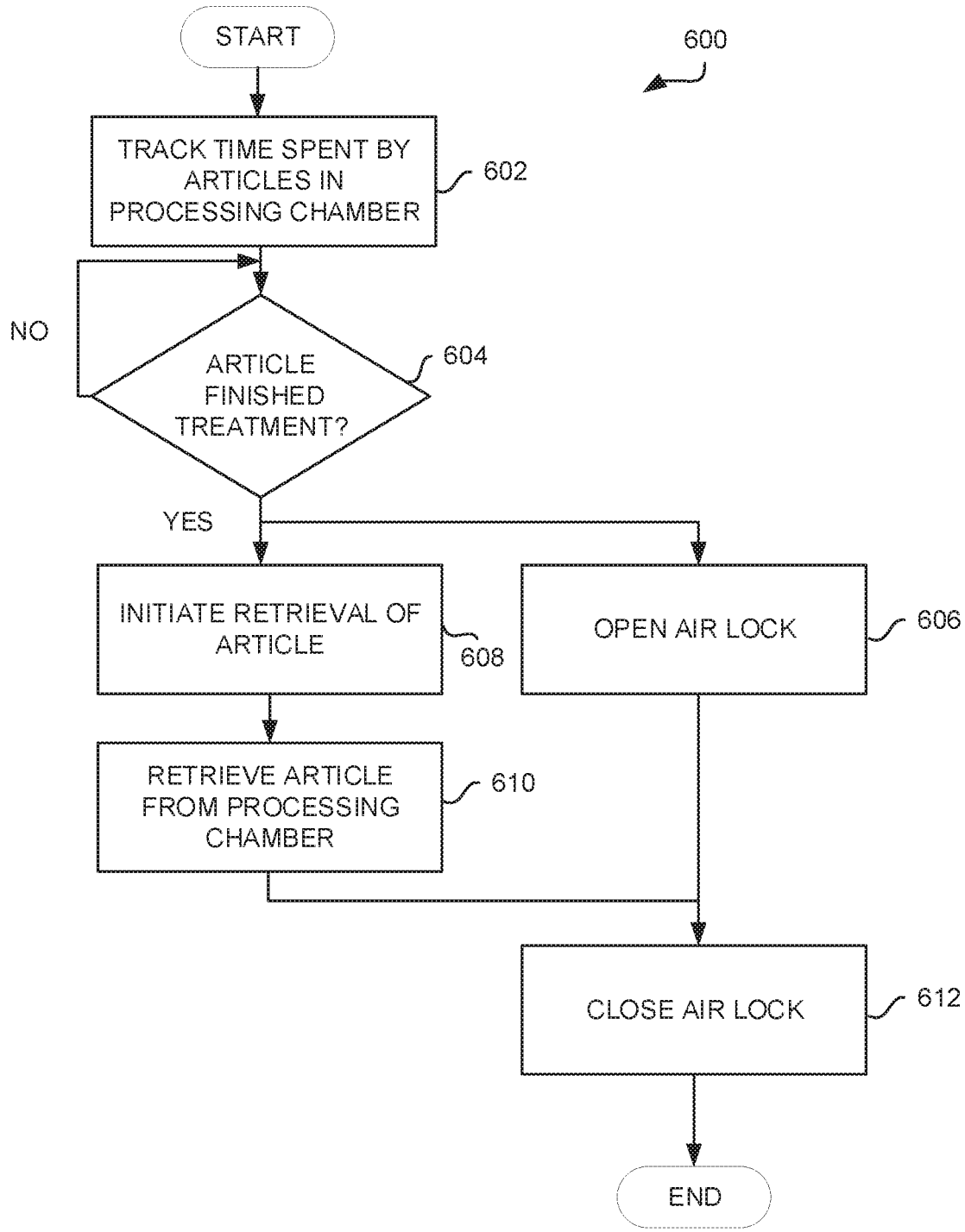
FIG. 6 is a flowchart of an example method for retrieving an article finished treatment from a chemical vapor processing chamber of an apparatus for automated chemical vapor processing.

FIG. 6 is a flowchart of an example method 600 for retrieving an article finished treatment from a chemical vapor processing chamber of an apparatus for automated chemical vapor processing, such as the apparatus 100 of FIG. 1 or the apparatus 300 of FIG. 3. For convenience, in the description of the data structure 404, reference will be made to the apparatus 300 of FIG. 3. One or more blocks of the method 600 may be embodied in a non-transitory machine-readable storage medium storing instructions executable the controller 350.

At block 602, the time spent by each article 302 in the chemical vapor processing chamber 310 is tracked. At block 604, it is determined whether an article 302 is finished treatment. Once an article is finished treatment, retrieval of the article is initiated at block 608, and the air lock 340 is opened at block 606. At block 610, the article 302 is retrieved from the chemical vapor processing chamber 310 and moved into the article loading chamber 320 by the automated conveyor 330. Retrieval of the article 302 may take place in a queue along with other articles 302 awaiting to be retrieved from the chemical vapor processing chamber 310. At block 612, the air lock 340 is closed.

FIG. 7A is a perspective view of an example air lock 700 for an apparatus for automated chemical vapor processing, such as the apparatus 100 of FIG. 1 or the apparatus 300 of FIG. 3. In other words, the air lock 700 may be one example of the air lock 140 of FIG. 1 or the air lock 340 of FIG. 3. For convenience, the air lock 700 will be described with reference to the apparatus 300 of FIG. 3.

Figure 7B:
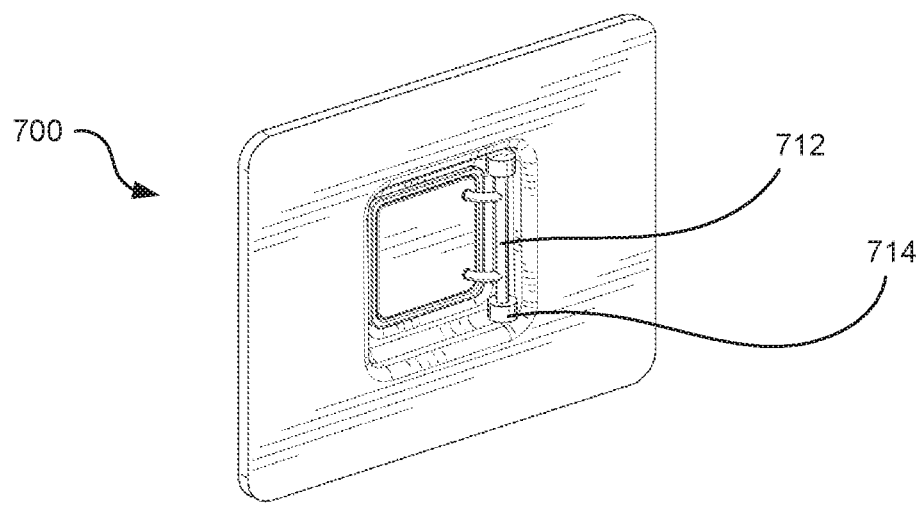
FIG. 7B is a perspective view of the air lock of FIG. 7A as viewed from the inside of a chemical vapor processing chamber.

FIG. 7A provides a view of the air lock 700 from inside the articling loading chamber 320, and FIG. 7B provides a view of the air lock from inside the chemical vapor processing chamber 310.

The air lock 700 includes a door 710 and a pneumatic seal 720. The pneumatic seal 720 is inflatable to seal the door 710 and is deflatable to allow the door 710 to open. The door 710 and pneumatic seal 720 may be controlled by a controller such as the controller 350 of FIG. 3. The pneumatic seal 720 may be inflated with air or another suitable gas.

The pneumatic seal 720 includes an air inlet 722 to receive air to pressurize and inflate the pneumatic seal 720 and air outlet 724 to expel air when the pneumatic seal 720 is deflated and depressurized. When the pneumatic seal 720 is inflated, an edge connection with the door 710 is made which blocks the door 710 from opening. Inflation and deflation of the pneumatic seal 720 is controlled by the controller 350. The door 710 includes a hinge 712 actuated by a servo motor 714 to rotate the hinge 712 to open the door 710 when controlled by the controller 350. Thus, the air lock 700 can be controlled to be opened to allow articles 302 to move between chambers 310, 320, and sealed to block chemical vapor from passing therethrough.

Figure 7C:
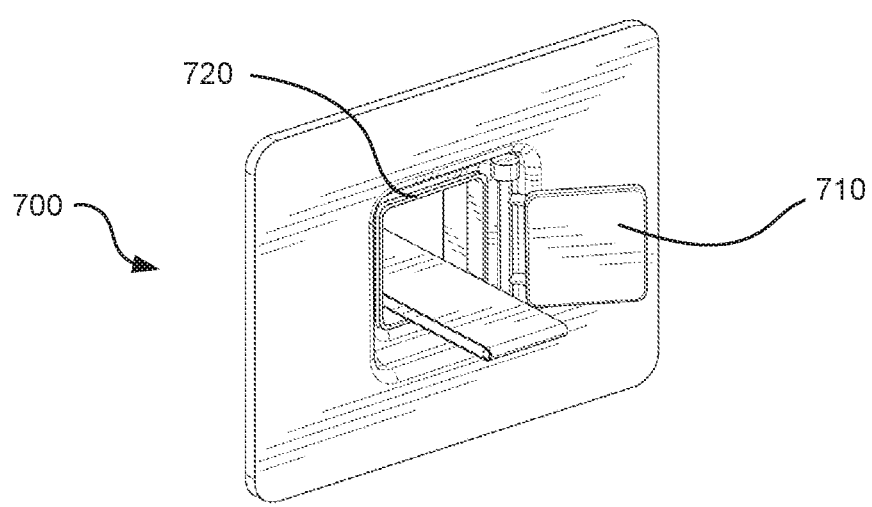
FIG. 7C is a perspective view of an example air lock for an apparatus for automated chemical vapor processing with a conveyor belt system to move articles through the air lock.

The air lock 700 is sized to permit the automated conveyor 330 to operate through the air lock 700 as appropriate. For example, FIG. 7C shows an example in which the automated conveyor 330 includes a conveyor belt that establishes a bridge between the chambers 310, 320, through the air lock 700.

Thus, it can be seen that chemical vapor processing may be operated in a continuous or semi-continuous manner, without clearing the processing chamber for new batches of articles, thereby saving manufacturing time, and in a manner which may be integrated with other continuously operating manufacturing systems. Further, articles that are to be exposed to chemical vapors for different lengths of times may be processed in parallel in the same processing chamber.

It should be recognized that features and aspects of the various examples provided above can be combined into further examples that also fall within the scope of the present disclosure. The scope of the claims should not be limited by the above examples but should be given the broadest interpretation consistent with the description as a whole.

The invention claimed is:

1. An apparatus comprising:
a chemical vapor processing chamber to treat articles with surface-smoothing chemical vapor;
an article loading chamber to receive the articles pending treatment by the chemical vapor processing chamber;
an automated conveyor to move the articles between the article loading chamber and the chemical vapor processing chamber;
an air lock to connect the article loading chamber to the chemical vapor processing chamber, the air lock comprises a door and a pneumatic seal, the pneumatic seal to inflate to seal the door and to deflate to allow the door to open; and
a controller to:
control the automated conveyor to move the articles between the article loading chamber and the chemical vapor processing chamber; and
control the air lock to seal the chemical vapor processing chamber from the article loading chamber when the automated conveyor is not moving the articles between the article loading chamber and the chemical vapor processing chamber.

2. The apparatus of claim 1, wherein the controller is further to control the air lock to open when the automated conveyor is moving the articles between the article loading chamber and the chemical vapor processing chamber.

3. The apparatus of claim 1, wherein the controller is further to:
track time spent by the articles in the chemical vapor processing chamber; and
control the automated conveyor to retrieve the finished articles from the chemical vapor processing chamber after pre-determined processing times.

4. The apparatus of claim 1, wherein the article loading chamber comprises a chemical vapor remover to remove chemical vapor from the article loading chamber.

5. The apparatus of claim 4, wherein the chemical vapor remover comprises a chemical vapor scrubber.

6. An apparatus comprising:
a chemical vapor processing chamber;
an article loading chamber connected to the chemical vapor processing chamber by an air lock to receive articles pending treatment by the chemical vapor processing chamber and to provide access to the articles finished treatment by the chemical vapor processing chamber, the article loading chamber including a plurality of access ports to receive the articles pending treatment and to provide access to the articles finished treatment;
an automated conveyor to move the articles between the article loading chamber and the chemical vapor processing chamber; and
a controller to:
control the automated conveyor to place the articles from the article loading chamber into the chemical vapor processing chamber;
track time spent by the articles in the chemical vapor processing chamber; and
control the automated conveyor to retrieve the finished articles from the chemical vapor processing chamber after pre-determined processing times.

7. The apparatus of claim 6, wherein the chemical vapor processing chamber includes a sensor to measure a processing condition in the chemical vapor processing chamber, and the controller is further to record the processing condition in a database.

8. The apparatus of claim 6, wherein the controller is further to label each article based on a particular access port through which the article was received and to track a position of each article in the apparatus using a label of the article.

9. The apparatus of claim 6, wherein the controller is further to restrict access through the access ports when the automated conveyor is moving the articles between the chemical vapor processing chamber and the article loading chamber.

10. The apparatus of claim 6, wherein the article loading chamber includes a sensor to detect chemical vapor in the article loading chamber, and the controller is further to restrict access through the access ports when the sensor detects an amount of chemical vapor above a threshold amount.

11. An apparatus comprising:
a chemical vapor processing chamber to treat articles with surface-smoothing chemical vapor;
an article loading chamber to receive the articles pending treatment by the chemical vapor processing chamber and to provide access to the articles finished treatment by the chemical vapor processing chamber;
an automated conveyor to place the articles into the chemical vapor processing chamber and to retrieve the articles from the chemical vapor processing chamber;
an air lock to seal the article loading chamber from the chemical vapor processing chamber when the automated conveyor is inactive; and
a controller to track time spent by the articles in the chemical vapor processing chamber and to cause the automated conveyor to retrieve the finished articles from the chemical vapor processing chamber according to a chemical vapor treatment schedule,
wherein the air lock comprises a pneumatic seal controllable by the controller to inflate to seal the chemical vapor processing chamber from the article loading chamber.

12. The apparatus of claim 11, wherein the controller further controls a processing condition in the chemical vapor processing chamber.

* * * * *